(12) United States Patent
Chang et al.

(10) Patent No.: US 7,523,914 B2
(45) Date of Patent: Apr. 28, 2009

(54) HIGH-HARDNESS AND CORROSION-TOLERANT INTEGRATED CIRCUIT PACKING MOLD

(76) Inventors: Yin Yu Chang, 235 Chung-Ho Box 8-24, Taipei (TW); Da Yung Wang, 235 Chung-Ho Box 8-24, Taipei (TW); Shien Chen Liu, 235 Chung-Ho Box 8-24, Taipei (TW)

( * ) Notice: Subject to any disclaimer, the term of this patent is extended or adjusted under 35 U.S.C. 154(b) by 427 days.

(21) Appl. No.: 11/172,028

(22) Filed: Jul. 1, 2005

(65) Prior Publication Data
US 2007/0001268 A1   Jan. 4, 2007

(51) Int. Cl.
  *B29C 45/14* (2006.01)
  *B29C 33/56* (2006.01)
  *H01L 21/56* (2006.01)
(52) U.S. Cl. .................................. 249/114.1; 425/116
(58) Field of Classification Search .............. 249/114.1; 425/116
  See application file for complete search history.

(56) References Cited

U.S. PATENT DOCUMENTS

| | | | | |
|---|---|---|---|---|
| 4,606,750 A | * | 8/1986 | Torii et al. | ............... 65/374.13 |
| 5,026,415 A | * | 6/1991 | Yamamoto et al. | ............ 65/305 |
| 6,287,711 B1 | * | 9/2001 | Nieh et al. | .................. 428/627 |

FOREIGN PATENT DOCUMENTS

| JP | 02154434 A | * | 6/1990 |
|---|---|---|---|
| JP | 09327844 A | * | 12/1997 |

\* cited by examiner

*Primary Examiner*—Robert B Davis

(57) ABSTRACT

A high-hardness and corrosion-tolerant integrated circuit packing mold comprises a package mold including at least one filling channel, at least one mold cavity, and at least one channel between the mold cavities; a protecting layer deposited upon surfaces of the package mold and the protecting layer being an amorphous coating layer. In one case, the protecting layer is a graded layer including an amorphous coating layer and a middle layer. In a second case, the protecting layer is a multilayer structure formed by at least one amorphous coating layer and at least one polycrystal coating layer. In the third case, the protecting layer is a compound structure formed by distributing polycrystal material into an amorphous coating layer.

7 Claims, 4 Drawing Sheets

HIGH-HARDNESS AND CORROSION-TOLERANT INTEGRATED CIRCUIT PACKING MOLD

FIELD OF THE INVENTION

The present invention relates to IC package, and in particular to a high-hardness and corrosion-tolerant integrated circuit packing mold, where a protecting layer is adhered to the surface of a package mold so as to protect the package mold from corrosion and wearing.

BACKGROUND OF THE INVENTION

The packaging of integrating circuit starts from the end of manufacturing of semiconductors. The object of the packaging is to increase the bearing and protection functions to protect the ICs from corrosion physically and chemically, to provide transferring paths of energy and signal distribution of the chips, to prevent the signals from delay so as not to affect the function of the system; and to provide heat dissipation path.

Referring to FIG. 1, in the process of IC packaging, the material is made of epoxy. The epoxy is melt to pass through a filling channel 91. The epoxy passes the filling channel 91 to the mold cavities 93 of the package mold 92 and the channel 94 between the mold cavities 93. After the package mold 92 is cooled, the resin will solidified so as to package the IC substrate and the semiconductors. However, in the packaging structure of the ICs, the pollution material (general carbide) accumulated on the surface of the mold cavities 93 of the package mold 92 and the corrosion on the surfaces of the mold cavities 93 will confine the lifetime of the package mold 92. Meanwhile, a long time is necessary to wash the package mold 92.

To improve the packing process, the surface process and design of the channels of the package mold 92 are important in the packaging of ICs. In one prior art, a protecting layer 95 is electric plated upon the surface of the package mold 92 with a thickness between 1 to 2 μm. The material of the protecting layer is hard chromium or polycrystal chromium nitride which is coated upon the surfaces of the mold cavities 93 so as to have preferred anti-corrosion ability and can be separated from the mold easily. However this prior art has the following disadvantages.

In the packaging process of the ICs, the resin will corrode the surfaces of the mold cavities 93 so that the corrosion is dramatic. In general, the Vickers hardness in electrical plating chromium to the protecting layer is about HV700. The corrosion will induce the viscosity on the surface of the mold cavities 93. This will reduce the lifetime of the package mold 92. Furthermore, a long time for clearing the package mold 92 is necessary.

Furthermore, in electrically plating chromium to the package mold 92, a high expense is necessary to clear the wasted water and gas in the electric plating process. Thereby a large operation space is necessary.

To coat nitride chromium to the package mold 92 by vacuum electric plating will have a Vickers hardness of HV1600 to 2000, but the protecting layer generally has a polycrystal cylindrical structure with worse anti-corrosion ability. Thereby the package mold 92 will be worn by the resin in packaging. Thereby it is difficult to separate from the mold.

As adhesive corrosion is formed on the surface of the package mold 92, the package mold 92 must be detached from a punching machine and is washed by strong acid or strong alkali which will corrode the surfaces of the mold cavities 93 of the package mold 92 with chromium or polycrystal nitride chromium so as to reduce the lifetime of the package mold 92.

SUMMARY OF THE INVENTION

Accordingly, the primary object of the present invention is to provide a high-hardness and corrosion-tolerant integrated circuit packing mold, where a protecting layer is adhered to the surface of a package mold so as to protect the package mold from corrosion and wearing.

To achieve above objects, the present invention provides a high-hardness and corrosion-tolerant integrated circuit packing mold comprising: a package mold including at least one filling channel, at least one mold cavity, and at least one channel between the mold cavities; a protecting layer deposited upon surfaces of the package mold and the protecting layer being an amorphous coating layer. In one case, the protecting layer is a graded layer including an amorphous coating layer and a middle layer. In a second case, the protecting layer is a multilayer structure formed by at least one amorphous coating layer and at least one polycrystal coating layer. In the third case, the protecting layer is a compound structure formed by distributing polycrystal material into an amorphous coating layer.

The various objects and advantages of the present invention will be more readily understood from the following detailed description when read in conjunction with the appended drawing.

DETAILED DESCRIPTION OF THE INVENTION

In order that those skilled in the art can further understand the present invention, a description will be described in the following in details. However, these descriptions and the appended drawings are only used to cause those skilled in the art to understand the objects, features, and characteristics of the present invention, but not to be used to confine the scope and spirit of the present invention defined in the appended claims.

Figure 1:
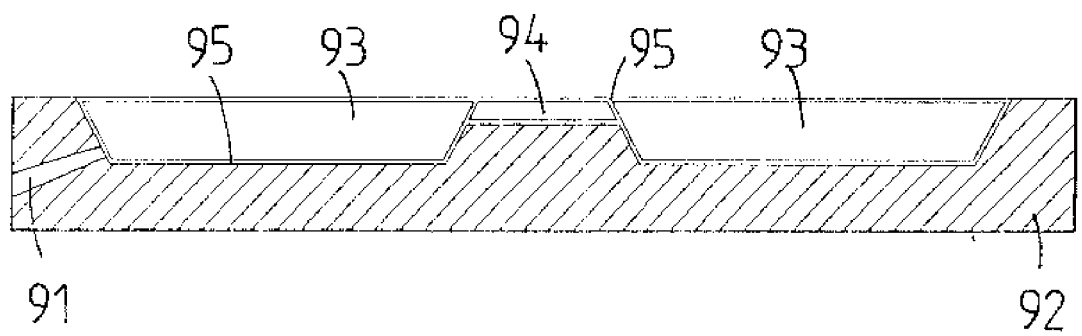
FIG. 1 is a partial schematic view of the prior art.
Figure 2:
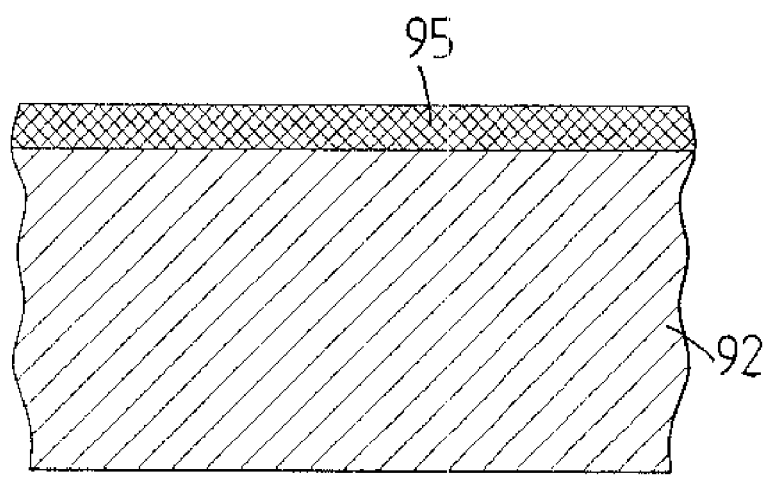
FIG. 2 is a partial enlarged view of the protecting layer of the prior art.
Figure 3:
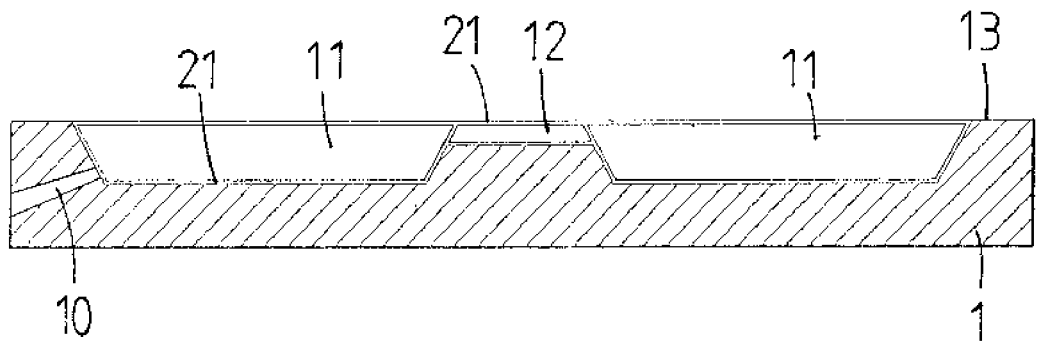
FIG. 3 is a schematic cross sectional view of the present invention.
Figure 4:
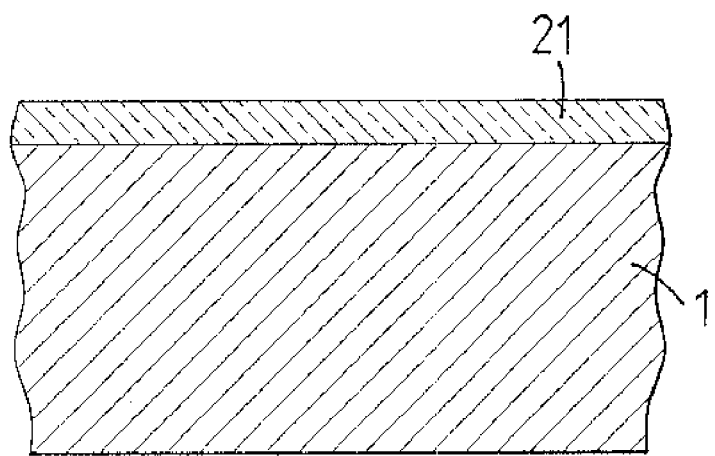
FIG. 4 is an enlarged schematic view of the protecting layer of the present invention.

With reference to FIGS. 3 and 4, the structure of the present invention is illustrated. The present invention is mainly a package mold 1. The package mold 1 mainly includes a filling channel 10, mold cavities 11, and a channel 12 between the mold cavities 11. The surfaces of the filling channel 10 and mold cavities 11 and the channel 12 are deposited with a protection layer by physical vapor deposition (PVD) or chemical vapor deposition (CVD). The protection layer is an amorphous coating layer 21. The amorphous coating layer 21 is mainly made of amorphous metal oxides (a-$Me_{1-x}C_x$), amorphous metal carbides (a-$Me_{1-y}C_y$)), amorphous metal carbide-nitrides (a-Me(C, N))), or amorphous silicon nitrides (a-$Si_{1-z}N_z$), in that the Me (metal) is mainly one of transition metals, such as Cr, Al, Ti, Zr, or other chemical elements, such as silicon (Si). Furthermore, in above materials, x is from 0.3 to 0.7, y is from 0.25 to 0.9, z is from 0.3 to 0.8. In this preferred embodiment, the thickness of the amorphous coating layer 21 is from 0.1 to 0.8 μm, preferably, 0.2 to 0.5 μm.

The amorphous coating layer 21 is not only coated upon the surfaces of the filling channel 10 and the mold cavities 11 and the channel 12, but also it can be deposited on all the upper surfaces 13 of the package mold 1 so as to protect the package mold 1 not to wear or corroded in the resin-packaging process.

The amorphous coating layer 21 used on the package mold 1 has a dense amorphous structure so as to increase the ability of anti-corrosion, moreover, the pollution on the channel 12 in the resin-packing process (generally, carbides are accumulated thereon) is reduced. Furthermore, the hardness of the amorphous coating layer 21 is greater than 30 Gpa, which is far higher than the hardness of the prior art coating layer. Thereby when high viscosity and high hardness solidified resins are applied thereon, the surfaces of the filling channel 10 and mold cavities 11 and the channel 12 are protected from wearing to have the effect of protecting the package mold 1.

Figure 5:
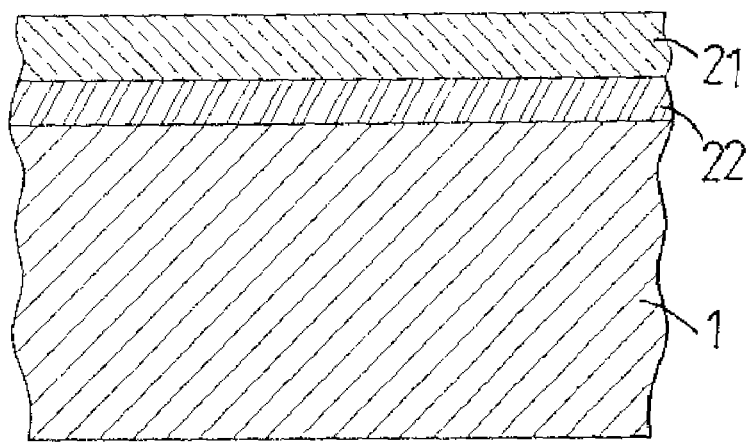
FIG. 5 is an enlarged schematic view of the protecting layer of the second embodiment of the present invention.

Referring to FIG. 5, the second embodiment of the present invention is illustrated. Those identical to the first embodiment will not described herein, only those different are described. To have preferred adhesion of the protection coating layer on the package mold 1, the protecting layer is formed as a graded layer. The surfaces of the filling channel 10 and mold cavities 11 and the channel 12 are deposited with a graded layer by physical vapor deposition (PVD) or chemical vapor deposition (CVD). In the process, a middle layer 22 is coated thereon firstly and then an amorphous coating layer 21 is formed. The middle layer 22 is formed by polycrystal or single crystal metals, mainly transition metal, such as Cr, Al, Ti, Zr, or other chemical elements, such as silicon (Si). The middle layer 22 is one of polycrystal metal nitride, polycrystal metal carbides, or polycrystal metal carbide-nitrides. The thickness of the middle layer 22 is between 0.01 μm to 3 μm, preferably between 0.01 μm to 1 μm. Moreover the atom ratios of the nitrogen or carbon in the polycrystal metal nitride, polycrystal metal carbides of the middle layer 22 is between 30% to 80%. The carbide-nitrides in the material of the polycrystal metal carbide-nitrides of the middle layer 22 is between 30% to 80%. The middle layer 22 is deposited on the surfaces of the filling channel 10 and mold cavities 11, the channel 12, and all the upper surface 13 of the package mold 1, and an amorphous coating layer 21 is deposited upon the middle layer 22. The structure, assembly and components of the amorphous coating layer 21 are identical to those in the first embodiment.

The graded layer in this embodiment causes that the surfaces of the filling channel 10 and mold cavities 11, the channel 12, and all the upper surface 13 of the package mold 1 have preferred adhesion. The hardness of the graded layer is greater than 30 GPa. Thereby when high viscosity and high hardness solidified resins are applied thereon, the surfaces of the filling channel 10 and mold cavities 11 and the channel 12 are protected from wearing to have the effect of protecting the package mold 1.

Figure 6:
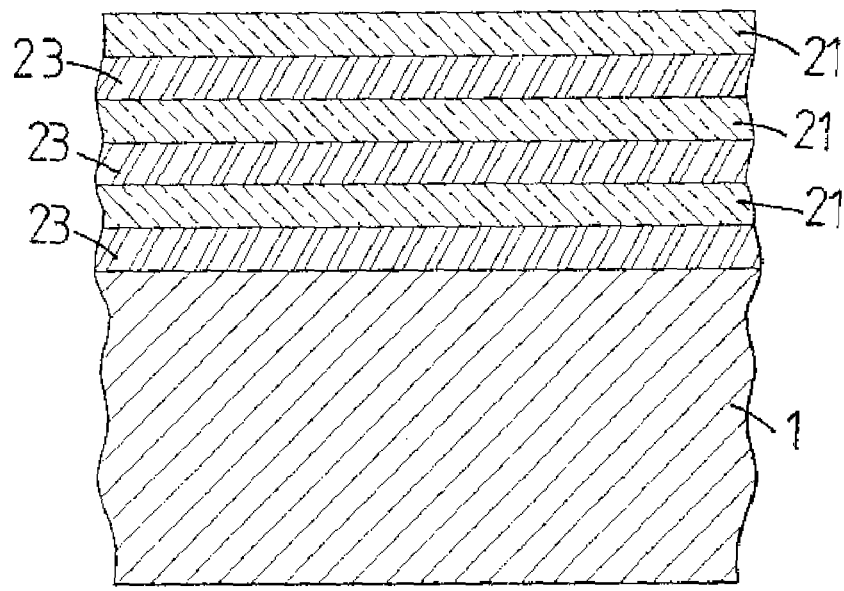
FIG. 6 is an enlarged schematic view of the protecting layer of the third embodiment of the present invention.

Referring to FIG. 6, the third embodiment of the present invention is illustrated. Those identical to the first embodiment will not described herein, only those different are described. In this embodiment, the protecting layer is made as a multi-layered coating. The surfaces of the filling channel 10 and mold cavities 11 and the channel 12 are deposited with a multi-layered coating layer by physical vapor deposition (PVD) by different metal targets or active gases. The multi-layered coating layer includes at least one amorphous coating layer 21, and a plurality of polycrystal coating layers 23, where the amorphous coating layers 21 and the polycrystal coating layers 23 are alternatively arranged. The polycrystal coating layer 23 is formed by polycrystal metal, mainly transition metal, such as Cr, Al, Ti, Zr, or other chemical elements, such as silicon (Si). The polycrystal coating layer 23 is one of polycrystal metal nitride, polycrystal metal carbides, or polycrystal metal carbide-nitrides. The thickness of the middle layer 22 is between 0.01 μm to 1 μm. Moreover the atom ratios of the nitrogen or carbon in the polycrystal metal nitride, polycrystal metal carbides of the middle layer 22 is between 30% to 80%. The polycrystal coating layer 23 is deposited on the surfaces of the filling channel 10 and mold cavities 11, the channel 12, and all the upper surface 13 of the package mold 1, and an amorphous coating layer 21 is deposited upon the polycrystal coating layer 23. Thickness of the amorphous coating layer 21 is between 0.001 μm to 1 μm. The structure, assembly and components of the amorphous coating layer 21 are identical to those in the first embodiment. The multi-layered structure is not confined to six layers illustrated in FIG. 6. The number of layers are ranged from 1 to 500 layers with a thickness from 0.1 μm to 10 μm, preferably from 0.2 μm and 0.5 μm.

In this embodiment, the coating layers are formed periodically, such as polycrystal chromium oxide (Cr1-xOx), amorphous coating silicon nitride (amorphous Si3N4). The multi-layered coating layer in this embodiment causes that the surfaces of the filling channel 10 and, mold cavities 11, the channel 12, and all the upper surface 13 of the package mold 1 have preferred adhesion. The hardness of the graded layer is greater than 30 GPa. Thereby when high viscosity and high hardness solidified resins are applied thereon, the surfaces of the filling channel 10 and mold cavities 11 and the channel 12 are protected from wearing to have the effect of protecting the package mold 1.

Figure 7:
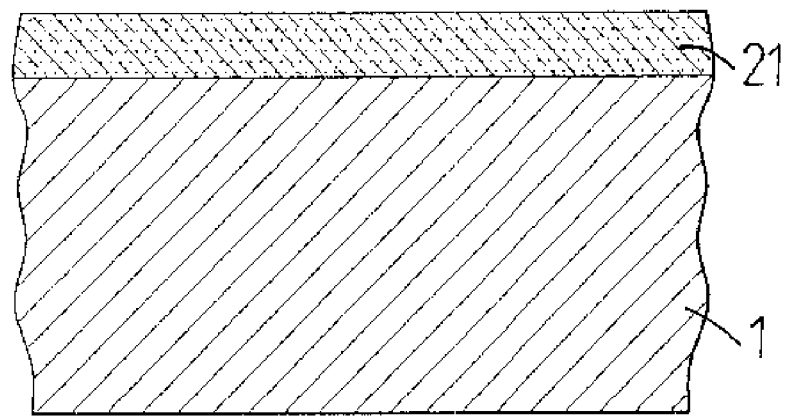
FIG. 7 is an enlarged schematic view of the protecting layer of the fourth embodiment of the present invention.
Figure 8:
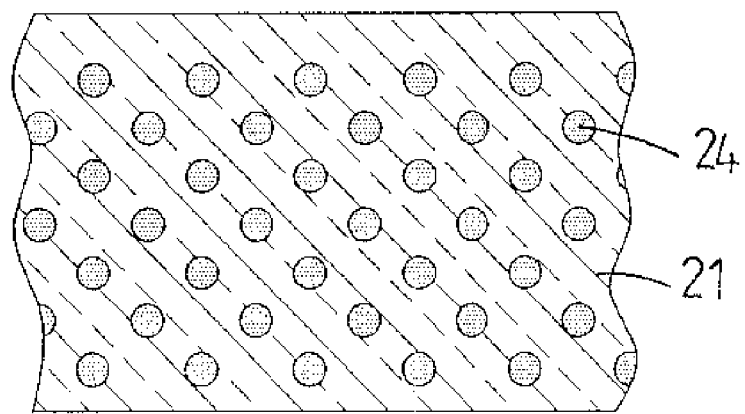
FIG. 8 is an enlarged schematic view of the compound coating layer of the fourth embodiment of the present invention.

Referring to FIGS. 7 and 8, the fourth embodiment of the present invention is illustrated. Those identical to the first embodiment will not described herein, only those different are described. The present invention is mainly a package mold 1. The surfaces of the filling channel 10 and mold cavities 11 and the channel 12 are deposited with a protection layer by physical vapor deposition (PVD) or chemical vapor deposition (CVD) by at least two metals or gases (nitrogen or hydrocarbon gas). The protection layer is an amorphous coating layer 21. The amorphous coating layer 21 is mainly a nano-compound formed by distributing polycrystal material into the amorphous coating layer 21. The polycrystal material is formed by polycrystal metal, mainly transition metal, such as Cr, Al, Ti, Zr, or other chemical elements, such as silicon (Si). The polycrystal coating layer 23 is one of polycrystal metal nitride, polycrystal metal carbides, or polycrystal metal carbide-nitrides. The sizes of the polycrystal material are about several nanometer between 5 nm to 10 nm. The thickness of the compound structure is between 0.1 μm to 10 μm, preferably between 0.2 to 5 μm. The compound coating layer has a size of nanometers and formed by polycrystal chromium nitride and amorphous silicon nitride. The polycrystal chromium nitride is distributed in the amorphous silicon nitride.

In this embodiment, the compound coating layer in this embodiment causes that the surfaces of the filling channel 10 and mold cavities 11, the channel 12, and all the upper surface 13 of the package mold 1 have preferred adhesion. The hardness of the graded layer is greater than 30 GPa. Thereby when high viscosity and high hardness solidified resins are applied thereon, the surfaces of the filling channel 10 and mold cavities 11 and the channel 12 are protected from wearing to have the effect of protecting the package mold 1.

Moreover the atom ratios of the nitrogen or carbon in the polycrystal metal nitride, polycrystal metal carbides of the middle layer 22 is between 30% to 80%. The polycrystal coating layer 23 is deposited on the surfaces of the filling channel 10 and mold cavities 11, the channel 12, and all the upper surface 13 of the package mold 1, and an amorphous coating layer 21 is deposited upon the polycrystal coating layer 23. Thickness of the amorphous coating layer 21 is between 0.001 μm to 1 μm. The structure, assembly and components of the amorphous coating layer 21 are identical to those in the first embodiment. The multi-layered structure is not confined to six layers illustrated in FIG. 6. The number of layers are ranged from 1 to 500 layers with a thickness from 0.1 μm to 10 μm, preferably from 0.2 μm and 0.5 μm.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A high-hardness and corrosion-tolerant integrated circuit packing mold comprising:
   a package mold including at least one filling channel, at least one mold cavity, and at least one channel between the mold cavities;
   a protecting layer deposited upon surfaces of the package mold and the protecting layer being an amorphous coating layer;
   wherein the protecting layer is a multilayer structure formed by at least one amorphous coating layer and at least one polycrystal coating layer; and
   wherein the polycrystal coating layer is selected from one of polycrystal metals, polycrystal metal nitrides, polycrystal metal carbides, polycrystal metal carbide-nitrides, where the metal is one of transition metals.

2. The high-hardness and corrosion-tolerant integrated circuit packing mold as claimed in claim 1, wherein the transition metal is selected from one of chromium, aluminum, and zirconium.

3. The high-hardness and corrosion-tolerant integrated circuit packing mold as claimed in claim 1, wherein the ratio of the nitrogen atom in the polycrystal metal nitride is from 30% to 80%.

4. A high-hardness and corrosion-tolerant integrated circuit packing mold comprising:
   a package mold including at least one filling channel, at least one mold cavity, and at least one channel between the mold cavities;
   a protecting layer deposited upon surfaces of the package mold and the protective layer being an amorphous coating layer;
   wherein the protecting layer is a graded layer including an amorphous coating layer and a middle layer;
   wherein the middle layer is one of a polycrystal metal layer, polycrystal metal nitride, a polycrystal metal carbide, and a polycrystal metal carbide-nitride; where the metal is one of transition metals; and
   wherein the ratio of the carbon atom in the polycrystal metal carbide is from 30% to 80%.

5. The high-hardness and corrosion-tolerant integrated circuit packing mold as claimed in claim 1, wherein the ratio of the carbon atom in the polycrystal metal carbide is from 30% to 80%.

6. A high-hardness and corrosion-tolerant integrated circuit packing mold comprising:
   a package mold including at least one filling channel, at least one mold cavity, and at least one channel between the mold cavities;
   a protecting layer deposited upon surfaces of the package mold and the protecting layer being an amorphous coating layer;
   wherein the protecting layer is a graded layer including an amorphous coating layer and a middle layer;
   wherein the middle layer is one of a polycrystal metal layer, polycrystal metal nitride, a polycrystal metal carbide, and a polycrystal metal carbide-nitride; where the metal is one of transition metals; and
   wherein the ratio of the carbon atom and nitrogen atom in the polycrystal metal carbide-nitride is from 30% to 80%.

7. The high-hardness and corrosion-tolerant integrated circuit packing mold as claimed in claim 1, wherein the ratio of the carbon atom and nitrogen atom in the polycrystal metal carbide-nitride is from 30% to 80%.

* * * * *